United States Patent
Marutani

(10) Patent No.: US 9,279,571 B2
(45) Date of Patent: Mar. 8, 2016

(54) LIGHT EMITTING DEVICE

(71) Applicant: NICHIA CORPORATION, Anan-shi, Tokushima (JP)

(72) Inventor: Yukitoshi Marutani, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 197 days.

(21) Appl. No.: 14/080,495

(22) Filed: Nov. 14, 2013

(65) Prior Publication Data

US 2014/0140079 A1    May 22, 2014

(30) Foreign Application Priority Data

Nov. 16, 2012    (JP) .................................. 2012-252211

(51) Int. Cl.
| | |
|---|---|
| F21S 4/00 | (2006.01) |
| F21V 21/00 | (2006.01) |
| F21V 21/14 | (2006.01) |
| H01L 25/075 | (2006.01) |
| H01L 33/62 | (2010.01) |

(52) U.S. Cl.
CPC ............ *F21V 21/14* (2013.01); *H01L 25/0753* (2013.01); *H01L 33/62* (2013.01); *H01L 2224/16225* (2013.01); *H01L 2224/32225* (2013.01); *H01L 2224/73204* (2013.01)

(58) Field of Classification Search
CPC .................................................. F21Y 2103/003
USPC ..................................................... 362/249.02
See application file for complete search history.

(56) References Cited

U.S. PATENT DOCUMENTS

| | | |
|---|---|---|
| 2005/0247944 A1 | 11/2005 | Haque et al. |
| 2010/0027291 A1 | 2/2010 | Hamada |
| 2010/0164409 A1* | 7/2010 | Lo et al. .................... 315/312 |
| 2011/0114989 A1 | 5/2011 | Suehiro et al. |

FOREIGN PATENT DOCUMENTS

| | | |
|---|---|---|
| AU | 2011213705 A | 9/2011 |
| JP | 05-45812 U | 6/1993 |
| JP | 2000-188001 A | 7/2000 |
| JP | 2004-103993 A | 4/2004 |
| JP | 2004-356144 A | 12/2004 |
| JP | 2005-322937 A | 11/2005 |
| JP | 2008-515236 A | 5/2008 |

(Continued)

OTHER PUBLICATIONS

Extended European Search Report of the corresponding European Application No. 13193261.8, dated Feb. 28, 2014.

*Primary Examiner* — Sean Gramling

(74) *Attorney, Agent, or Firm* — Global IP Counselors, LLP

(57) ABSTRACT

A light emitting device includes a substrate member and at least one light emitting element. The substrate member has a groove portion defined between two wiring portions spaced apart from each other. The groove portion includes a first groove portion, a second groove portion, and a third groove portion. The first groove portion extends in a direction that forms a slanted angle with respect to a first direction, the second groove portion is spaced apart from the first groove and extends in a direction that forms a slanted angle with respect to the first direction, and the third groove portion is interconnected with the first groove portion and the second groove portion. The light emitting element is disposed over the third groove portion.

6 Claims, 6 Drawing Sheets

(56) References Cited

FOREIGN PATENT DOCUMENTS

| JP | 2008-535233 A | 8/2008 |
| JP | 2011-228463 A | 11/2011 |
| JP | 2012-142362 A | 7/2012 |
| WO | 2006-037068 A2 | 4/2006 |
| WO | 2006-103596 A2 | 10/2006 |
| WO | 2008-099531 A1 | 8/2008 |
| WO | 2012127355 A1 | 9/2012 |

* cited by examiner

LIGHT EMITTING DEVICE

CROSS-REFERENCE TO RELATED APPLICATION

This application claims priority to Japanese Patent Application No. 2012-252211, filed on Nov. 16, 2012. The entire disclosure of Japanese Patent Application No. 2012-252211 is hereby incorporated herein by reference.

BACKGROUND OF THE INVENTION

1. Field of the Invention

The present invention relates to a light emitting device which includes a substrate member and at least one light emitting element.

2. Description of the Related Art

There has been proposed a light emitting device which includes light emitting elements arranged on a flexible substrate member (see JP2005-322937A). The light emitting device described in JP2005-322937A can be rolled up during the transportation, and also can be cut in a desired size for use.

SUMMARY OF THE INVENTION

However, in the light emitting device described in JP 2005-322937A, there is a problem in that, for example, when the light emitting device is bent, concentration of stress is tend to be experienced between the light emitting elements and the substrate member.

The present invention is devised in the light of such circumstances, and it is hence an object thereof to provide a light emitting device in which stress experienced between a light emitting element and a substrate member can be reduced.

A light emitting device according to an aspect of the present invention includes a substrate member and at least one light emitting element. The substrate member includes a flexible base member, a plurality of wiring portions, and a groove portion. The flexible base member has a side extending in a first direction along a longitudinal direction and a side extending in a second direction different from the first direction. The wiring portions are disposed on the base member. The groove portion is defined between adjacent ones of the wiring portions spaced apart from each other. At least one light emitting element is disposed on the substrate member and connected to the wiring portions. The groove portion includes a first groove portion extending in a direction that forms a slanted angle with respect to the first direction, a second groove portion spaced apart from the first groove portion and extending in a direction that forms a slanted angle with respect to the first direction, and a third groove portion interconnected with the first groove portion and the second groove portion. The at least one light emitting element is disposed over the third groove portion.

According to the present invention, a light emitting device can be provided which can prevent stress experienced between at least one light emitting element and a substrate member.

DETAILED DESCRIPTION OF EMBODIMENTS

Next, embodiments of the invention will be described with reference to the drawings. In the description of the drawings below, the same or similar components are denoted by the same or similar reference symbols. However, it should be noted that the drawings are drawn schematically, and the dimensional ratios and the like of the components may differ from the actual ratios. Accordingly, the specific dimension and the like should be determined in consideration of the description below. In addition, the drawings may also include the components that have different dimensional relations and ratios among one another.

Structure of Light Emitting Device 100

Figure 1:
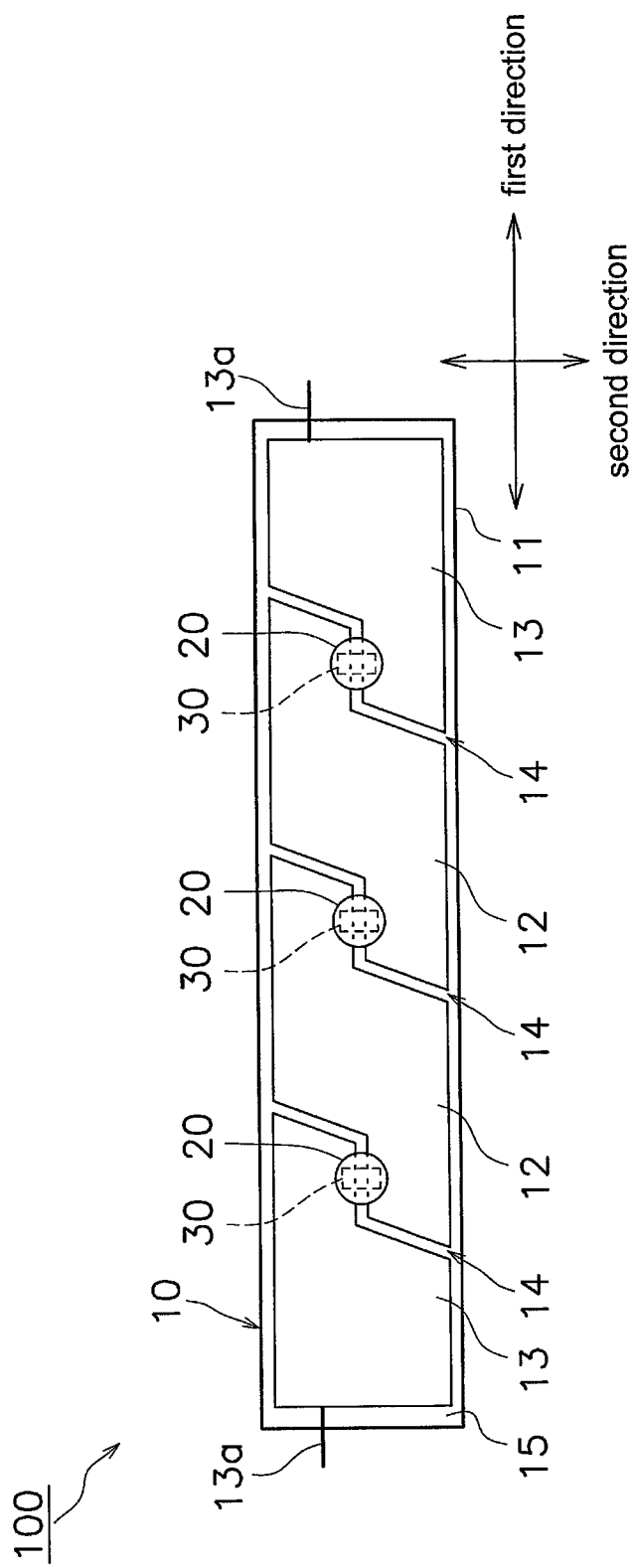
FIG. 1 is a plan view of a light emitting device.
Figure 2:
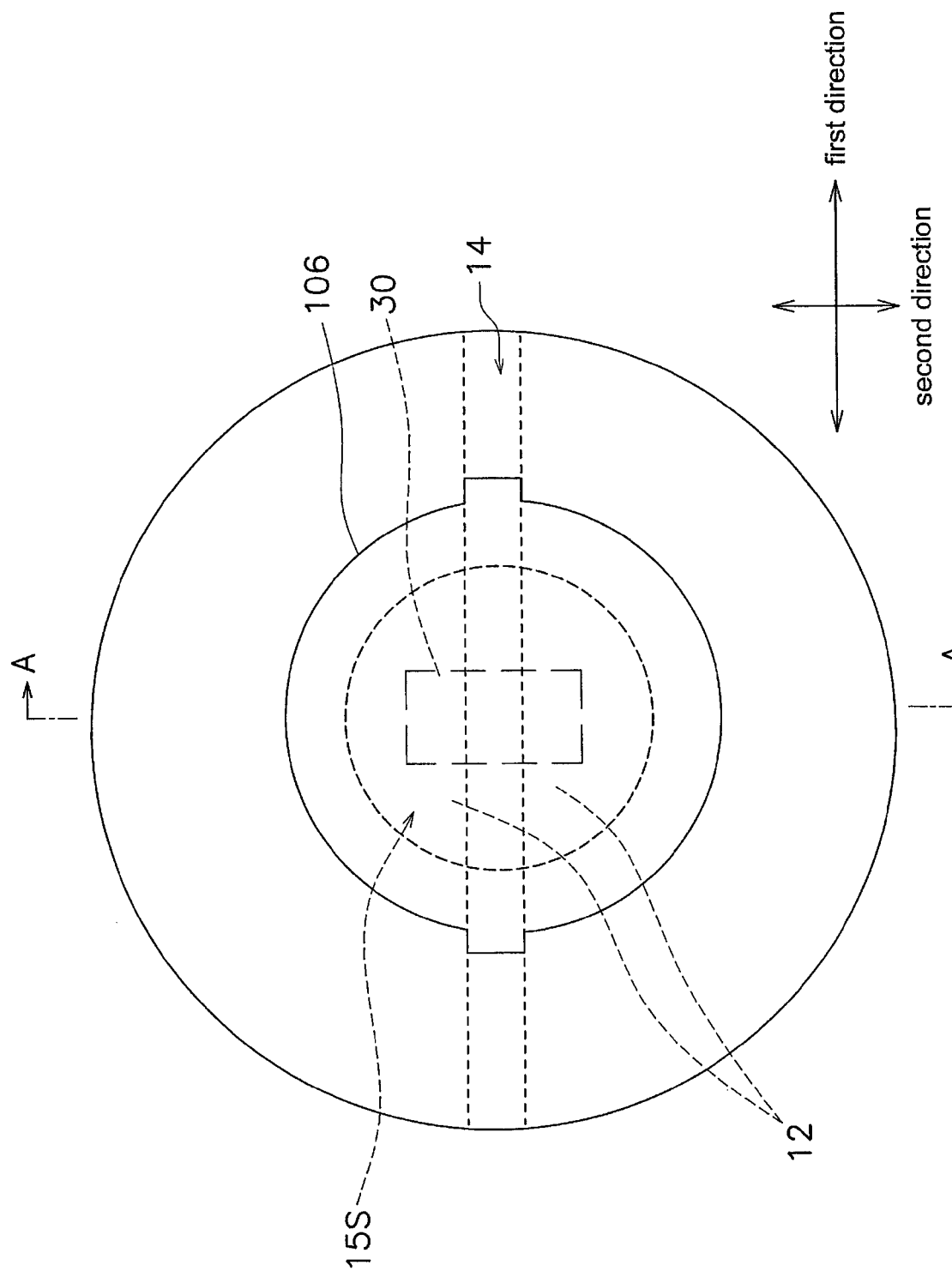
FIG. 2 is an enlarged plan view in the vicinity of a sealing member shown in FIG. 1.
Figure 3:
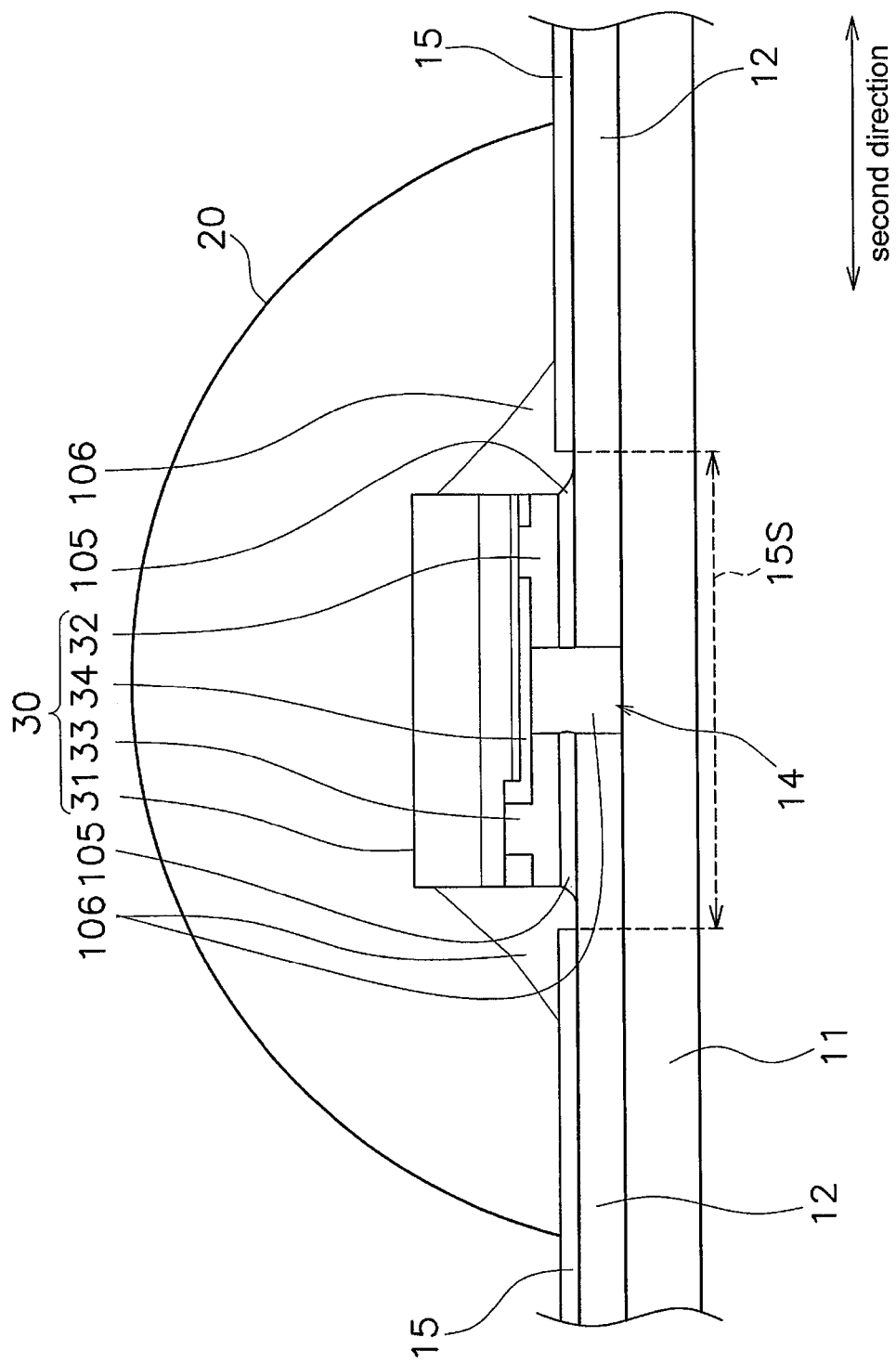
FIG. 3 is a cross sectional view taken along line A-A of FIG. 2.

A structure of a light emitting device 100 according to an embodiment will be described with reference to the drawings. FIG. 1 is a plan view showing a structure of a light emitting device 100. FIG. 2 shows an enlarged plan view of a sealing member 20. FIG. 3 is a cross sectional view taken along line A-A of FIG. 2.

The light emitting device 100 includes a substrate member 10, three sealing members 20, and three light emitting elements 30. The light emitting device 100 is flexible, so that it can be stored rolled-up on a reel etc., and can be installed along a curved surface.

1. Structure of Substrate Member 10

The substrate member 10 is a flexible elongated member. The first direction corresponds to the longitudinal direction of the substrate member 10 and the second direction which is substantially perpendicular to the first direction corresponds to the lateral direction of the substrate member 10. The ratio of the lengths of the substrate member 10 in the longitudinal direction and the lateral direction can be appropriately selected, and for example, a ratio of 6:1, 30:1, or 100:1 can be employed. The length of the substrate member 10 in the first direction can be, for example, 1150 mm, and the length of the substrate member 10 in the second direction can be, for example, 15 mm. The substrate member 10 includes a flexible base member 11, two wiring portions 12, two terminal portions 13, three groove portions 14, and a reflection layer 15.

The base member 11 can be made of a flexible insulating material. For such a material, an insulating resin such as polyethylene terephthalate and polyimide can be preferably used but is not limited thereto. For example, the base member 11 may be made of a strip of copper foil or aluminum foil which is covered with an insulating resin. The base member 11 can have a thickness of about 10 μm to about 100 μm, for example. The material of the base member 11 can be appropriately selected in view of the type of mounting of the light emitting elements 30, the reflectance, and adhesion with other members, etc. For example, in the case where a solder is used for mounting the light emitting elements 30, a polyimide which has a high heat-resisting property is preferably used, and in the case where the reflection layer 15 is not disposed on the base member 11, a material which has a high optical reflectance (for example a white color material) is preferably used to obtain a light emitting device having a good light extraction efficiency.

In the case where the base member 11 is made solely of a resin, the resistance to bending of the substrate member 10 decreases significantly, and thus, the effects of the present invention can be exhibited effectively.

The two wiring portions 12 are arranged on a main surface of the base member 11. The two wiring portions 12 are arranged between the two terminal portions 13. The two wiring portions 12 are placed along the first direction. The two wiring portions 12 are arranged spaced apart from each other. With this configuration, the groove portion 14 to be described below is defined between the two wiring portions 12. The wiring portions 12 as described above are made of a thin metal film such as a copper foil or an aluminum foil, for example. The wiring portions 12 have a thickness which does not impair the flexibility of the substrate member 10 and a thickness of 8 μm to 150 μm is preferable. The wiring portions 12 are preferably arranged on the base member 11 respectively with a largest possible area. Widening the surface area of the wiring portions 12 allows for increased heat dissipation from the wiring portions 12. The corners of the wiring portions 12 in a plan view are preferably rounded for improving the adhesion (anti-detachment feature) of the wiring portions, which can enhance the reliability. The corners are preferably rounded with a radius of 100 μm or more.

The two terminal portions 13 can be arranged on the main surface of the base member 11. The two terminal portions 13 can be arranged along the first direction at both sides of the two wiring portions 12. Each terminal portion 13 is arranged spaced apart from the corresponding wiring portion 12. With this configuration, the groove portion 14 is formed in between the terminal portion 13 and the corresponding wiring portion 12. An external wiring 13a can be connected to each terminal portion 13. The external wirings 13a may be connected to corresponding portions of known connectors disposed on the substrate member 10.

Three groove portions 14 are formed on the base member 11, as the groove portions 14 being defined between the adjacent two wiring portions 12 and between the wiring portions 12 and the corresponding terminal portions 13 respectively. As shown in FIG. 1, the groove portion 14 as a whole extends generally at a slanted angle to the first direction and the second direction. The center portion in the second direction of the groove portion 14 is bent in a crank-shape as shown in FIG. 1. The width of the groove portion 14 (that is, the interval between the two wiring portions 12, and the interval between the wiring portion 12 and the corresponding terminal portion 13) can be, for example, about 0.05 mm to about 5 mm. The detailed configuration of the groove portions 14 will be described below.

The reflection layer 15 can be used to cover the exposed surfaces of the base member 11, two wiring portions 12 and two terminal portions 13. The reflection layer 15 may also cover the inner surfaces of the groove portions 14. Thus, the reflection layer 15 can cover approximately the entire upper surface of the substrate member 10 except for the openings 15S to be described below. Such a reflection layer 15 is made of a material which can reflect the emitted light (including the wavelength-converted light by a wavelength converting member) from the light emitting elements 30. For such a material, an insulating white ink which is a so-called white resist made of a silicone resin containing titanium oxide is preferably used but is not limited thereto.

Also, the reflection layer 15 is formed with three openings 15S to dispose three light emitting elements respectively. FIG. 2 and FIG. 3 show one of the openings 15S formed over the two wiring portions 12. As shown in FIG. 2 and FIG. 3, in the opening 15S, the two wiring portions 12 are exposed. Meanwhile, in the opening 15S formed over the wiring portion 12 and the terminal portion 13, the wiring portion 12 and the terminal portion 13 are exposed.

The openings 15S can be formed in an appropriate shape such as a circular shape or a quadrangular shape adapted to surround the light emitting elements 30 in plan view, respectively. After the light emitting elements 30 are mounted, the openings 15S are preferably covered with an underfill material 106, a sealing member 20, and/or other appropriate light-reflection member. With this arrangement, the portion around the light emitting elements 30 can be protected. At this time, the use of a material having a higher optical reflectance than that of the substrate member 10 and the wiring portion 12 which are exposed in the opening 15S for the covering can improve the light extraction efficiency of the light emitting device.

Also, the openings 15S can be smaller than the shape in a plan view of the light emitting elements 30, with the reflection layer 15 disposed extending below the light emitting elements 30. The reflection layer 15 may be disposed to surround the bonding member of each light emitting element so that the opening is not substantially formed. In this case, the light extraction efficiency can be enhanced without using an underfill etc., which is to be described below.

2. Structure of Sealing Member 20

The three sealing members 20 may be arranged on the substrate member 10. The three sealing members 20 are disposed so as to enclose the three openings 15S formed in the reflection layer 15. The three sealing members 20 are placed along the first direction. The three sealing members 20 seals the three light emitting elements 30 respectively. The sealing member 20 is, as shown in FIG. 3, formed in an approximately hemispherical shape with the light emitting element 30 at the center, but is not limited thereto, an appropriate shape such as a rectangular parallelepiped shape, a semicircular column shape, etc., can be employed.

Such sealing members 20 are made up of a light transmissive resin (for example, an epoxy resin, a urea resin, a silicone resin and the like). The sealing members 20 may contain a light diffusing material (barium sulfate, titanium oxide, aluminum oxide, silicon oxide, etc.).

The material of the sealing members 20 is not limited to a resin material as described above, and a light-transmissive material such as glass may be employed.

The sealing members 20 preferably contains a wavelength converting member which can absorb emission from the light emitting elements 30 and emits light of different wavelength. With this arrangement, a light emitting device to emit light of a desired color can be obtained. Examples of such a wavelength converting member include an oxide-based fluorescent material, a sulfide-based fluorescent material, and a nitride-based fluorescent material. It is preferable that, particularly with the use of a gallium nitride based light emitting element to emit blue light as the light emitting elements 30, a fluorescent material to absorb blue light, such as a YAG-based fluorescent material or a LAG-based fluorescent material to emit yellow to green light, a SiAlON-based fluorescent material to emit green light, and a SCASN-based fluorescent material and a CASN-based fluorescent material to emit red light, are preferably used singly or in combination. With this arrangement, a light emitting device to emit white light can be obtained.

More specifically, for the light emitting devices used for the display devices such as backlights of liquid crystal displays and TV-screens, a SiAlON-based fluorescent material and a SCASN-based fluorescent material are preferably used singly or in combination. With this arrangement, a light emitting device having high color reproducibility can be obtained. Also, in a light emitting device for lighting applications, a YAG-based fluorescent material or a LAG-based fluorescent material and a SCASN-based fluorescent material or a CASN-based fluorescent material are preferably used in combination. With this arrangement, a lighting device having high color rendering property can be obtained.

The use of the wavelength converting member as described above is not limited to be contained in the sealing member 20, but can be used external of the light emitting device 100, for example, disposed in a display device or a lighting device which uses the light emitting device 100 as its light source.

3. Structure of Light Emitting Element

The three light emitting elements 30 are arranged on the substrate member 10. The three light emitting elements 30 can be respectively disposed in the three openings 15S formed in the reflection layer 15. The three light emitting elements 30 are placed along the first direction. The light emitting element 30 placed at the middle of the three light emitting elements 30 is connected to two wiring portions 12. The light emitting elements 30 at each side of the three light emitting elements 30 are connected to the wiring portion 12 and the terminal portion 13 respectively. As shown in FIG. 2, each light emitting element 30 is arranged along the second direction and the longitudinal direction of each light emitting element 30 can be in parallel with the second direction.

In the embodiment, each of the three light emitting elements 30 is, as shown in FIG. 3, mounted on the substrate member 10 in a flip-chip manner. Each light emitting element 30 is connected to a pair of wiring portions 12 via a pair of bonding members 105 respectively. The bonding member 105 can be made of, for example, a solder such as a Sn—Ag—Cu based solder, an Au—Sn base solder, or a Sn—Cu based solder, a metal such as Au, an anisotropic conductive paste, or an Ag paste. An underfill material 106 can be filled between each light emitting element 30 and the base member 11. The underfill material 106 is, as shown in FIG. 2, preferably disposed not only on the two wiring portions 12 but also on the reflection layer 15. With this arrangement, the light extraction efficiency can be enhanced and also the light emitting elements 30 can be supported firmly. The underfill material 106 can be made of, for example, a silicone resin or an epoxy resin, a fluororesin, or a hybrid resin containing one or more those resins. The underfill material 106 preferably has a light reflecting property by containing titanium oxide, silicon oxide, or alumina, which has a white color. With this arrangement, the light extraction efficiency of the light emitting elements can be enhanced.

Also, as shown in FIG. 3, the light emitting element 30 may include a semiconductor structure 31, a p-side electrode 32, an n-side electrode 33, and an insulating layer 34. The semiconductor structure 31 includes an n-type layer, an active layer, and a p-type layer which are stacked in the order on a light-transmissive sapphire substrate. The n-type layer, the active layer and the p-type layers can be respectively made of, for example, a gallium nitride-based semiconductor. The p-side electrode 32 and the n-side electrode 33 are respectively connected to a pair of wiring portions 12 via a pair of bonding members 105. The n-side electrode 33 can extend to a lower portion of the p-type layer via the insulating material layer 34. The p-side electrode 32 and the n-side electrode 33 are disposed so that the portions facing each other can be in parallel with each other. This arrangement facilitates disposition (mounting) over the third groove portion 143 (see FIG. 4) to be described below. The p-side electrode 32 and the n-side electrode 33 preferably have approximately same size and shape. With this arrangement, the stress experienced on the light emitting elements 30 caused by bending of the substrate member 10 can be dispersed, so that malfunction of the light emitting elements 30 can be reduced.

Configuration of Groove Portion 14

Figure 4:
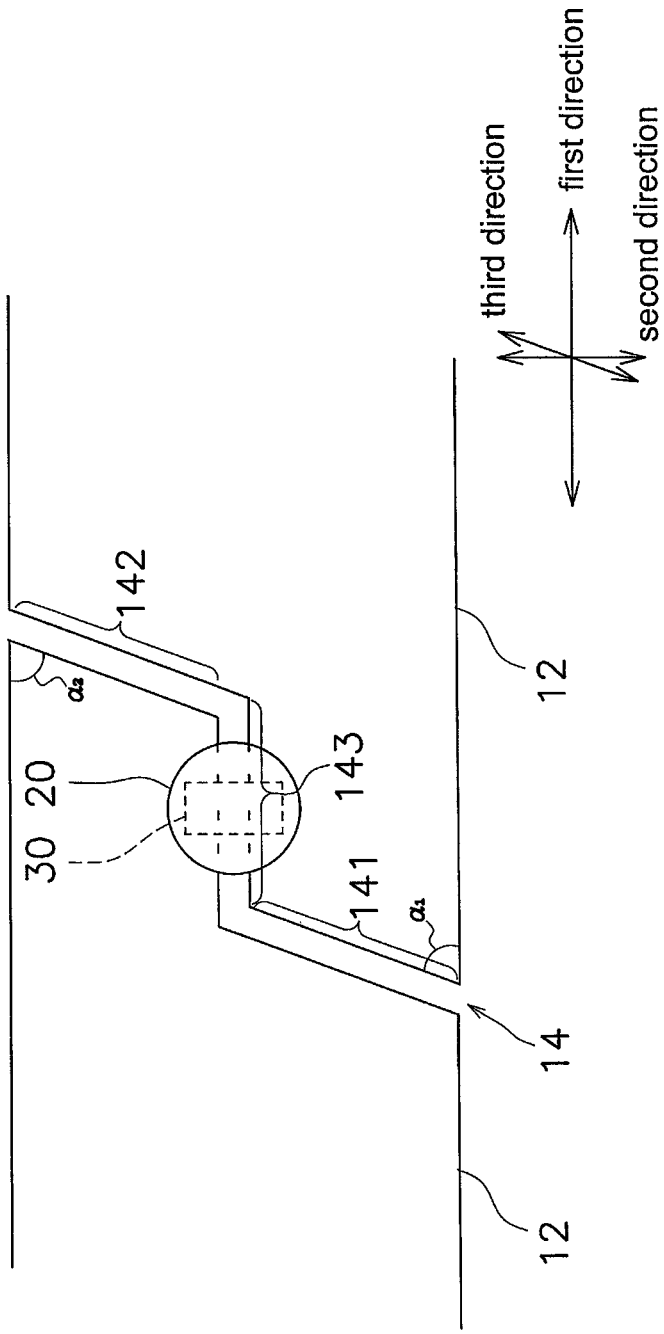
FIG. 4 is a partially enlarged view of FIG. 1.

Next, the configuration of the groove portion 14 will be described with reference to the drawings. FIG. 4 shows a partially enlarged view of FIG. 1. The groove portion 14 includes a first groove portion 141, a second groove portion 142, and a third groove portion 143.

The first groove portion 141 extends along the direction (hereinafter referred to as a "third direction") which is at an angle $\alpha_1$ ($0°<\alpha_1<90°$) to the first direction. The second groove portion 142 extends along the direction which is at an angle $\alpha_2$ ($0°<\alpha_2<90°$) to the first direction. The first groove portion 141 and the second groove portion 142 are spaced apart from each other in the first direction. Also, the first groove portion 141 and the second groove portion 142 are spaced apart from each other in the second direction. Thus, the first groove portions 141 and the second groove portions 142 are not formed on the same straight line. In the present embodiment, the first groove portion 141 and the second groove portion 142 may have similar lengths to each other, but according to the location of the light emitting element 30, different length may be employed. In the present embodiment, the first groove portion 141 and the second groove portion 142 are substantially in parallel with each other ($\alpha_1=\alpha_2=\alpha$) but they may be formed so as not to be parallel to each other ($\alpha_1 \neq \alpha_2$).

A third groove portion 143 is interconnected with a first groove portion 141 and a second groove portion 142. The third groove portion 143 extends along the first direction. Thus, the third groove portion 143 is, as shown in FIG. 4, at an angle greater than 90 degrees to the first groove portion 141 and the second groove portion 142, respectively. In the present embodiment, the third groove portion 143 has a length smaller than the respective lengths of the first groove portion 141 and the second groove portion 142, but the length is not limited to them.

In this embodiment, the light emitting element 30 is disposed over the third groove portion 143. The light emitting element 30 is spaced apart from the first groove portion 141. The light emitting element 30 is spaced apart from the second groove portion 142. Thus, the light emitting element 30 is disposed only over the third groove portion 143 of the groove portion 14. In a similar manner, a sealing member 20 which seals the light emitting element 30 is arranged over the third groove portions 143. The sealing member 20 is spaced apart from the first groove portion 141. The sealing member 20 is spaced apart from the second groove portion 142. Thus, the sealing member 20 is disposed only over the third groove portion 143 of the groove portion 14. The sealing member 20 is preferably spaced apart from the first groove portion 141 and the second groove portion 142 respectively at 0.5 mm or greater, in the first direction.

The angle $\alpha_1$ of the first groove portion 141 to the first direction is preferably 30 degrees or greater. With the angle $\alpha_1$ of 30 degrees or greater, the reflection layer 15 can be prevented from being damaged by the corner of the wiring portion 12. Particularly, with the angle $\alpha_1$ of 45 degrees or greater, the reflection layer 15 can be further prevented from being damaged by the corner of the wiring portion 12 when the substrate member 10 bends. Also, with the angle $\alpha_1$ in a range of 70 degrees to 85 degrees, the arrangement degree of freedom of the sealing member 20 and the light emitting element 30 can be improved. The above can be applied in a similar manner to the angle $\alpha_2$ of the second groove portion 142 to the first direction.

The light emitting device 100 as described above employs the flexible substrate member 10, so that a roll-to-roll processing method can be used for manufacturing.

Performance and Effects

In the light emitting device 100, the groove portion 14 includes a first groove portion 141 and the second groove portion 142 each extending in the third direction and a third groove portion 143 interconnected with the first groove portion 141 and the second groove portion 142. Each light emitting element 30 is disposed over the third groove portion 143.

The light emitting device 100 has a smaller thickness at the groove portion 14. Therefore, if the groove portions 14 are formed along the second direction, at the time when the light emitting device 100 is rolled up in the first direction, the light emitting device 100 bends at a small curvature at the groove portions 14. As a result, a large stress may be experienced between the light emitting element 30 and the substrate member 10.

Whereas, in the present embodiment, the first groove portion 141 and the second groove portion 142 extend in the third direction which is different from the second direction. As a result, even in the case where the light emitting device 100 is rolled up in the first direction, the light emitting device 100 can be prevented from bending with a small curvature at the groove portion 14. Thus, a large stress can be prevented from being applied on the portions between the light emitting element 30 and the substrate member 10.

Other Embodiments

The present invention is described with reference to the embodiment illustrated in the accompanying drawings. It should be understood, however, that the description and the drawings are intended as illustrative of the present invention, and the scope of the present invention is not limited to those described above. Various alternate embodiments, examples, and operational technologies will become apparent to one skilled in the art, from the description provided herein.

(1) In the above embodiment, the substrate member 10 includes two wiring portions 12 placed along the first direction and two terminal portions 13, but is not limited thereto. The substrate member 10 may include three or more wiring portions and three or more terminal portions 13. In this case, the plurality of wiring portions may be arranged in the second direction. Also, in this case, the light emitting element 30 and the sealing member 20 may be arranged over three or more wiring portions 12.

(2) In the above embodiment, the substrate member 10 includes a terminal portion 13, but is not limited thereto. The substrate member 10 may include a wiring portion 12 having a connector to connect to an external wiring 13a alternative to the terminal portion 13.

(3) In the above embodiment, all the wiring portions 12 and the terminal portions 13 have the sealing member 20 and the light emitting element 30 respectively arranged thereover, but are not limited thereto. The light emitting element 30 or/and the sealing member 20 may be not disposed on a part of the wiring portions 12 or on the terminal portions 13.

(4) In the above embodiment, one light emitting element 30 is connected to two wiring portions 12, but two or more light emitting elements 30 may be connected to two wiring portions 12.

(5) In the above-described embodiment, one sealing member 20 seals one light emitting element 30, but one sealing member 20 may seal two or more light emitting elements 30.

(6) In the above-described embodiment, a planar shape of the wiring portions 12 is shown in FIG. 1 for purposes of illustration and not limitation. The planar shape of the wiring portions 12 may be changed appropriately according to the size of the substrate member 10 and to the number of the light emitting element 30 to be used.

(7) In the above-described embodiment, the groove portion 14 has a shape of combination of linear groove portions, but is not limited thereto. At least a part of the groove portion 14 may be formed with a curved shape, a wavy shape, or the like.

Figure 5:
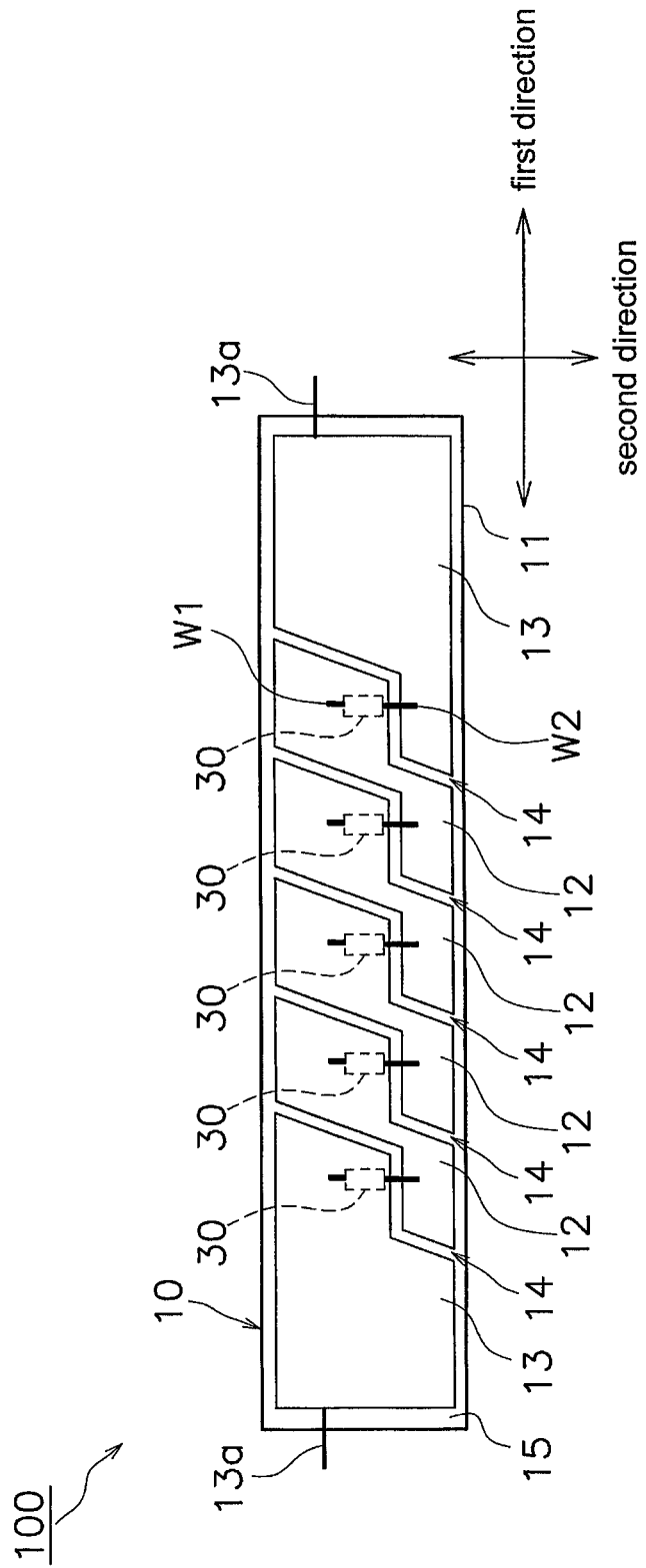
FIG. 5 is a plan view of a light emitting device.

(8) In the above embodiment, the light emitting elements 30 are mounted in a flip-chip manner, but are not limited thereto. For example, the light emitting elements 30 may be mounted by using die bonding or wire bonding technology. More specifically, as shown in FIG. 5, each of the light emitting elements 30 which is die-bonded on the wiring portion 12 or the terminal portion 13 (an example of first wiring portion) is electrically connected to the wiring portion 12 or the terminal portion 13, to which the light emitting element 30 is die bonded respectively, through a wire W1, and is electrically connected to adjacent wiring portion 12 or terminal portion 13 (an example of second wiring portion) through a wire W2. In this case, it is preferable that the wire W2 is bonded to the wiring portion 12 or the terminal portion 13 to which the light emitting element 30 is die bonded, and bridging over the third groove portion 143, is bonded to adjacent wiring portion 12 or the terminal portion 13. Also, the wire W2 is preferably connected to the light emitting element 30 along the second direction (that is along the lateral direction). With the wire W2 arranged along the second direction, in the case where the substrate member 10 is bent, occurrence of problems such as disconnection of the wire W2 due to the stress experienced on the wire W2 can be prevented. As described above, in the case where mounting is performed by way of wire bonding, the sealing member 20 preferably covers the wire W2 in addition to the light emitting element 30. With this arrangement, problems such as disconnection of the wire W2 can be prevented.

(9) In the above-described embodiment, three groove portions 14 are arranged spaced apart from one other when viewed from the second direction, but not limited thereto. For example, as shown in FIG. 5, adjacent groove portions 14 may be arranged overlapping with each other when viewed from the second direction.

(10) In the above-described embodiment, the third groove portion 143 of the groove portion 14 is disposed at a center portion in the second direction of the light emitting device 100, but not limited thereto. For example, as shown in FIG. 5, the third groove portion 143 may be disposed at a location a predetermined distance from the center portion in the second direction of the light emitting device 100. In this case, the light emitting device 30 is preferably disposed at a center portion in the second direction of the light emitting device 100.

(11) In the above-described embodiment, three groove portions 14 have a same shape, but is not limited thereto. The three groove portions 14 may have different shapes from each other. More specifically, the angles of the first groove portion 141, the second groove portion 142, and the third groove portion 143 with respect to the first direction may be different in three groove portions 14.

(12) In the above-described embodiment, a pair of terminal portions 13 are disposed respectively at the both sides in the first direction of the plurality of wiring portions 12, but are not limited thereto. The pair of terminal portions 13 may be formed extending in the first direction at the both sides in the second direction of the plurality of wiring portions 12. Thus, each of the pair of terminal portions 13 is formed elongated in the first direction, so that at the time when the substrate member 10 is bend, stress experienced on the light emitting elements 30 and the sealing members 20 can be reduced.

(13) In the above-described embodiment, the light emitting device 100 includes three sets of the groove portion 14, the sealing member 20, and the light emitting element 30, but is not limited thereto. The light emitting device 100 may include four or more sets (for example, 10 sets, 50 sets, 100 sets, or 200 sets) of the groove portion 14, the sealing member 20, and the light emitting element 30. That is, the light emitting device 100 may include four or more sealing members 20 and four or more light emitting elements 30. In this case, the interval between the sealing members 20 in the first direction can be, for example, 2 mm, 5 mm, 10 mm, 30 mm, 70 mm, or 100 mm.

(14) In the above-described embodiment, the first groove portion 141 and the second groove portion 142 of the groove portion 14 are respectively formed linearly in the third direction, but are not limited thereto. The end portions in the second direction of the first groove portion 141 and the second groove portion 142 may be rounded. With this arrangement, the reflection layer 15 can be prevented from being damaged by the corners of the wiring portion 12.

Further, the groove portion 14 may include a fourth groove portion disposed continuous to the first groove portion 141 and at a slanted angle to the first direction and/or a fifth groove portion disposed continuous to the second groove portion 142 and at a slanted angle to the first direction.

(15) Although specifically described in the above-described embodiment, the wiring portion 12 may have a cut-off portion for self-alignment of the light emitting element 30. More specifically, as shown in the plan view in FIG. 6, each of the pair of wiring portions 12 may have a pair of recessed portions 12a. The bonding member 105 connecting the light emitting element 30 with a pair of wiring portions 12 is disposed in the connecting region 12R formed in between the pair of recessed portions 12a. Thus, the bonding member 105 is held between the pair of recessed portions 12a which allows self-alignment of the light emitting elements 30 at respective predetermined positions. The bonding regions 12R preferably have a width approximate to the shape of the electrodes of the corresponding light emitting elements 30, and more preferably have a size approximate to the size of the electrodes. With the arrangement described above, preferable self-alignment of the light emitting elements 30 can be achieved.

Figure 6:
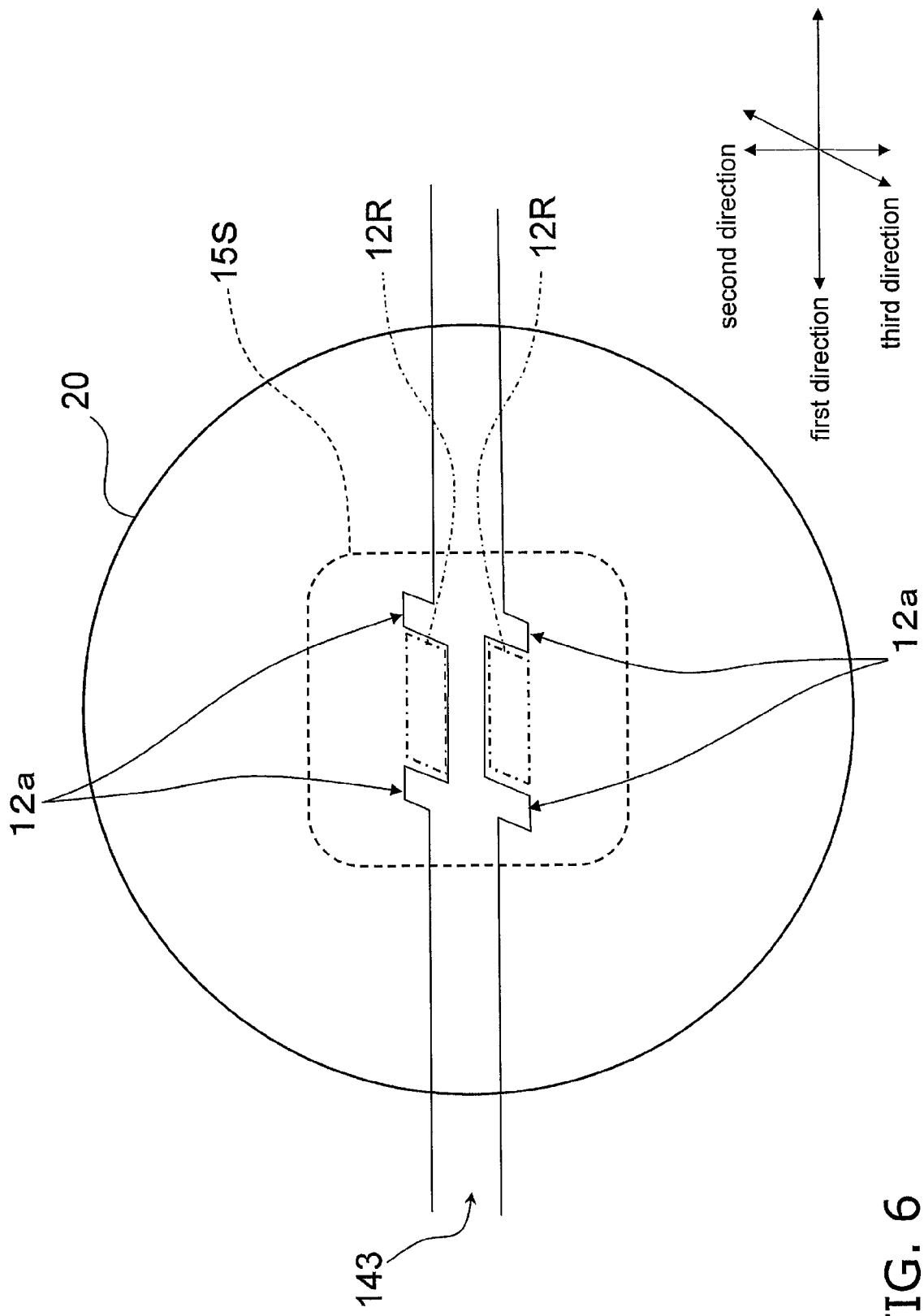
FIG. 6 is an enlarged plan view of a wiring portion.

Here, as shown in FIG. 6, the pair of recessed portions 12a are preferably formed along the third direction. Thus, the pair of recessed portions 12a are formed along a direction intersecting the second direction allows reduction of the stress generated by bending the substrate member 10 expressed on the light emitting elements 30. Also, in FIG. 6, the bonding regions 12R have a parallelogram shape but the shape is not limited to this, a rectangular shape or a circular shape may be employed according to the shape of the electrodes of the light emitting element.

(16) In the above-described embodiment, the plurality of light emitting elements 30 are connected in parallel, but the connection is not limited to this, an appropriate connection such as series connection, series-parallel connection, parallel-series connection, or the like, can be employed.

(17) The light emitting elements 30 may be so-called bare chips as described above, but chips in which a layer including a wavelength converting member, and/or a light-reflecting layer, etc. is previously disposed around such bare chips can also be used.

(18) In the above-described embodiment, the sealing members 20 are disposed only over the third groove portions 143 and spaced apart from the first groove portions 141, which is preferable for protection of the sealing member 20, but the arrangement is not limited to this. That is, the sealing members 20 may be disposed, each extending over the corresponding first and second groove portions.

(19) In the above-described embodiment, the third groove portions 143 are formed at the same positions in the second direction (in the same straight line along the first direction), but the arrangement is not limited to this. That is, in the case where a plurality of third groove portions are formed, the third groove portions may be located at different positions in the second direction.

As described above, it should be obvious that various other embodiments are possible without departing the spirit and scope of the present invention. Accordingly, the scope and spirit of the present invention should be limited only by the following claims.

What is claimed is:
1. A light emitting device comprising:
a substrate member including
a flexible base member having a side extending in a first direction along a longitudinal direction and a side extending in a second direction different from the first direction,
a plurality of wiring portions disposed on the base member, and
a groove portion defined between adjacent ones of the wiring portions spaced apart from each other; and
at least one light emitting element disposed on the substrate member and connected to the wiring portions,
wherein the groove portion includes a first groove portion extending in a direction that forms a slanted angle with respect to the first direction in a plan view of the substrate, a second groove portion spaced apart from the first groove portion and extending in a direction that forms a slanted angle with respect to the first direction in a plan view of the substrate, and a third groove portion interconnected with the first groove portion and the second groove portion, and
the at least one light emitting element is disposed over the third groove portion.
2. The light emitting device according to claim 1, wherein the first groove portion and the second groove portion are spaced apart from each other in the first direction and the second direction respectively.
3. The light emitting device according to claim 1, wherein the third groove portion extends in the first direction.
4. A light emitting device comprising:
a substrate member including
a flexible base member having a side extending in a first direction along a longitudinal direction and a side extending in a second direction different from the first direction,
first and second wiring portions disposed on the base member, and
a groove portion defined between the first and second wiring portions spaced apart from each other; and at least one light emitting element disposed on the substrate member and connected to the first and second wiring portions,
  wherein the groove portion includes a first groove portion extending in a direction that forms a slanted angle with respect to the first direction in a plan view of the substrate, a second groove portion spaced apart from the first groove portion and extending in a direction that forms a slanted angle with respect to the first direction in a plan view of the substrate, and a third groove portion interconnected with the first groove portion and the second groove portion, and
the at least one light emitting element is die-bonded to the first wiring portion, and
a wire is electrically connected to the at least one light emitting element, bridges over the third groove portion, and is bonded to the second wiring portion.

5. The light emitting device according to claim 4, wherein the wire is electrically connected to the at least one light emitting element along the second direction.

6. The light emitting device according to claim 1, further comprising
  a sealing member disposed on the substrate member to seal the at least one light emitting element,
  wherein the sealing member is spaced apart from the first groove portion and the second groove portion.

* * * * *